(12) United States Patent
Kwak et al.

(10) Patent No.: US 11,906,558 B2
(45) Date of Patent: Feb. 20, 2024

(54) SPECTRUM ANALYZER AND METHOD OF CONTROLLING THE SAME

(71) Applicant: INNOWIRELESS CO., LTD., Seongnam-si (KR)

(72) Inventors: Young Su Kwak, Suwon-si (KR); Kyoung Hwan Ju, Suwon-si (KR)

(73) Assignee: INNOWIRELESS CO., LTD., Seongnam-si (KR)

( * ) Notice: Subject to any disclaimer, the term of this patent is extended or adjusted under 35 U.S.C. 154(b) by 0 days.

(21) Appl. No.: 17/970,658

(22) Filed: Oct. 21, 2022

(65) Prior Publication Data

US 2023/0037910 A1 Feb. 9, 2023

Related U.S. Application Data

(62) Division of application No. 16/871,664, filed on May 11, 2020, now Pat. No. 11,740,269.

(30) Foreign Application Priority Data

May 28, 2019 (KR) ........................ 10-2019-0062629

(51) Int. Cl.
*G01R 23/173* (2006.01)
*G01R 23/167* (2006.01)

(52) U.S. Cl.
CPC ......... *G01R 23/173* (2013.01); *G01R 23/167* (2013.01)

(58) Field of Classification Search
CPC .......................... G01R 23/167; G01R 23/173
See application file for complete search history.

(56) References Cited

U.S. PATENT DOCUMENTS

2003/0177156 A1* 9/2003 Van Der Valk .... H03H 17/0226
708/313
2003/0185176 A1* 10/2003 Lusky ...................... H04L 1/20
370/335

(Continued)

FOREIGN PATENT DOCUMENTS

| CN | 102109555 B | 11/2014 |
|---|---|---|
| CN | 104122444 B | 10/2016 |
| CN | 108548958 A | 9/2018 |

(Continued)

*Primary Examiner* — Jeff W Natalini
(74) *Attorney, Agent, or Firm* — NKL LAW; Jae Youn Kim

(57) ABSTRACT

A spectrum analyzer having a memory function to adopt a digital-data-based frequency sweep scheme while achieving performance comparable to performance of a high-speed FFT spectrum analyzer, and a method of controlling the spectrum analyzer, in which the spectrum analyzer includes: an ADC for converting a BWP signal, which is at least one analog unit frequency band signal, into a digital data sample at a predetermined sample rate according to a span set by a user; a digital sweep part for sweeping the data sample passed through the ADC while digitally decimating the data sample through a decimation processing block having a two-stage cascaded structure, and processing the swept data sample to increase a frequency sweep speed; and a control unit for controlling the digital sweep part according to various items input, set, and selected by the user to perform spectrum analysis and output a spectrum analysis result.

5 Claims, 2 Drawing Sheets

(56) References Cited

U.S. PATENT DOCUMENTS

2018/0367123 A1*  12/2018  Gudovskiy ........... G06F 17/141
2020/0132741 A1*   4/2020  Nishimura ......... G01R 13/0272

FOREIGN PATENT DOCUMENTS

| JP | 2005-318304 A | 11/2005 |
|---|---|---|
| KR | 10-2007-0026243 A | 3/2007 |
| KR | 10-2007-0101584 A | 10/2007 |
| KR | 10-2010-0034576 A | 4/2010 |
| KR | 10-2014-0048030 A | 4/2014 |

\* cited by examiner

SPECTRUM ANALYZER AND METHOD OF CONTROLLING THE SAME

BACKGROUND OF THE INVENTION

1. Field of the Invention

The present invention elates to a spectrum analyzer and a method of controlling the same, and more particularly, to a spectrum analyzer, which has a memory function to adopt a digital-data-based frequency sweep scheme while achieving performance comparable to performance of a high-speed FFT spectrum analyzer, and a method of controlling the spectrum analyzer.

2. Description of the Related Art

The spectrum of wireless communication signals is regulated and limited by communication standard/technical regulation, and is a very important factor in measuring and determining conformance of equipment to the standard. For example, 3GPP, which has proposed fifth generation (5G) wireless communication standard (release 15), has induced to check characteristics of signals such as a spectrum mask, an occupied bandwidth, a channel power, and an error vector magnitude (EVM) of a communication signal.

Meanwhile, spectrum analysis of the communication signal is performed through a spectrum analyzer. Such spectrum analyzers are classified into a spectrum analyzer using a fast Fourier transform (FFT) scheme and a spectrum analyzer using a sweep tuning scheme (hereinafter simply referred to as "swept spectrum analyzer") according to a scheme used to obtain a spectrum of a signal.

Since the FFT spectrum analyzer simultaneously generates and processes $N_{fft}$ frequency resolution bandwidth (hereinafter referred to as "RBW") filters, the FFT spectrum analyzer may achieve high-speed performance, whereas the FFT spectrum analyzer consumes a large amount of resources because it requires multiple RBW filters with a high-speed analog-to-digital converter (ADC), so that a field programmable gate array (FPGA) having high performance and a high cost is required. Moreover, in order to support the FFT spectrum analyzer with functions such as a video bandwidth (hereinafter referred to as "VBW") filter and a detector, which are derived from a conventional analog swept spectrum analyzer, it is necessary to store cumulative spectrum results in a time domain, which requires a large amount of memory.

Meanwhile, the swept spectrum analyzer operates by selecting an arbitrary frequency in a frequency band occupied by an input RF signal, and obtaining a power level of the selected frequency. In other words, the FFT spectrum analyzer simultaneously acquires power levels of an RF signal in an entire frequency band by fast Fourier transform, while the swept spectrum analyzer acquires (sweeps) power level of the RF signal for each frequency one at a time. Therefore, the swept spectrum analyzer is inevitably inferior to the FFT spectrum analyzer in terms of a spectrum analysis speed, whereas the swept spectrum analyzer may allow a device to be manufactured at much lower cost than the FFT spectrum analyzer.

Spectrum analyzers generally have measurement functions shown in Table 1 below. In particular, vector spectrum analyzers have EVM measurement functions.

TABLE 1

| Classification | Specification | Note |
| --- | --- | --- |
| Frequency range | 1 MHz-7.5 GHz | |
| Span | 1 kHz-7.5 GHz | |
| Resolution bandwidth (RBW) | 1 Hz-10 MHz | 1x/3x step |
| Video bandwidth (VBW) | 1 Hz-10 MHz | 1x/3x step |
| Displayed average noise level (DANL) | −145 dBm/Hz or less | |
| Channel power/bandwidth measurement function | 100 MHz or more | |
| Measurement of adjacent channel leakage ratio (ACLR) | −50 dBc/channel or less | Advanced function |
| Measurement of spectral emission mask (SEM) | Supported | Advanced function |
| Measurement of spurious emission (SE) | Supported | Advanced function |
| Error vector magnitude (EVM) | Supported | Advanced function |

[Mathematical formula 1]

$$t_{sweep}[\sec] = k * \frac{\text{span}[Hz]}{RBW[Hz] * VBW[Hz]}$$

In Mathematical formula 1, k denotes a factor indicating the number of samples additionally required to compensate for a sample loss caused by a filter used to implement the spectrum analyzer. For example, when k=4, a sweep time as shown in Table 2 below is required to complete a single spectrum analysis result screen.

TABLE 2

| Classification | Sweep time | Note |
| --- | --- | --- |
| Span = 100 MHz<br>RBW = 100 kHz<br>VBW = 100 kHz | 4*100*10^6/(100*10^3)<br>^2 = 0.04[sec] | Appropriate<br>($t_{sweep}$ <1[sec]) |
| Span = 1 kHz<br>RBW = 1 Hz<br>VBW = 1 Hz | 4*10^3/(1)^2 = 4000[sec] | Inappropriate<br>($t_{sweep}$ >>1[sec]) |

As shown in Table 2, in the case of the swept spectrum analyzer, it was found that a time required to complete a result analysis screen greatly varies depending on various combinations of span, which is an entire measurement target frequency bandwidth, RBW, and VBW. In particular, 5G communication signals frequently have a signal length of 1 ms, which means that the signal analysis is impossible in most RBWs.

DOCUMENTS OF RELATED ART

Related art 1: Korean Unexamined Patent Publication No. 10-2014-0048030 (entitled "Apparatus for Analyzing Digital Spectrum and Method Thereof")

Related art 2: Korean Unexamined Patent Publication No. 10-2007-0101584 (entitled "Spectrum Analyzer")

Related art 3: Korean Unexamined Patent Publication No. 10-2007-0026243 (entitled "Data Processing Method for Spectrum Analyzer")

Related art 4: Korean Unexamined Patent Publication No. 10-2010-0034576 (entitled "Method for Analyzing Spectrum by Using Sweep Scheme")

SUMMARY OF THE INVENTION

To solve the problems described above, an object of the present invention is to provide a spectrum analyzer, which has a memory function to adopt a digital-data-based frequency sweep scheme while achieving performance comparable to performance of a high-speed FFT spectrum analyzer, and a method of controlling the spectrum analyzer.

To achieve the objects described above, according to one aspect of the present invention, there is provided a spectrum analyzer including: an analog-to-digital converter (ADC) for converting a bandwidth part (BWP) signal, which is at least one analog unit frequency band signal, into a digital data sample at a predetermined sample rate according to a span set by a user; a digital sweep part for sweeping the data sample passed through the ADC while digitally decimating the data sample through a decimation processing block having a two-stage cascaded structure, and processing the swept data sample to increase a frequency sweep speed; and a control unit for controlling the digital sweep part according to various items input, set, and selected by the user to perform spectrum analysis and output a result of the spectrum analysis.

In the above configuration, the spectrum analyzer may further include an RF processing part for RF-sweeping and outputting an input RF signal corresponding to at least one BWP signal according to the span set by the user.

The spectrum analyzer may further include: an input user interface (UI) for receiving, from the user, a desired measurement item and various set values required for measuring the measurement item, including the span, a resolution bandwidth (RBW), and a video bandwidth (VBW); and an output UI for displaying a measurement result to allow the user to recognize the measurement result, wherein the RF processing part, the ADC, the control unit, and the digital sweep part may be configured together in a same main body, and the input UI and the output UI may be mounted on a terminal separate from the main body to transmit and receive UI data to and from the main body through wireless communication.

The digital sweep part may include: a gate unit which functions to analyze a spectrum in synchronization with a desired signal section; and first and second decimation processing blocks respectively including first and second input buffers connected in the two-stage cascaded structure to store data used while sweeping frequencies, first and second direct digital synthesizers (DDS) configured by a numerically-controlled oscillator (NCO) to function as a local oscillator (ID) for generating a conversion frequency which is required for digital frequency sweep, and first and second CIC filters for reducing an amount of processing target data by performing decimation required for data processing which is suitable for a RBW set by the user.

The spectrum analyzer may further include: an RBW filter for performing RBW filtering; a VBW filter for performing a VBW filtering function; an envelope detector for extracting a waveform of an output signal of the RBW filter; a third CIC filter for performing decimation or interpolation suitable for an RBW-to-VBW ratio (RBW/VBW); and a detector for extracting four VBW output values of a maximum value (max), a minimum value (min), a sum, and a sample for an output of the VBW filter.

Signal synchronization at the gate unit may be performed by using an internal frame synchronization signal, a GPS signal, 1-pulse-per-second (1PPS) signal, or a 5G new radio (NR) sync signal block (SSB) signal.

A decimation rate ($N_{d1}$) of the first CIC filter and a decimation rate ($N_{d2}$) of the second CIC filter may be multiplied to obtain a total decimation rate ($N_d = N_{d1} * N_{d2}$).

The data stored in the first and second input buffers may be reused without receiving additional data during the digital frequency sweep.

The control unit may store, in a lookup table, decimation rates ($N_{d1}$ and $N_{d2}$) of the first and second CIC filters and a total decimation rate ($N_d = N_{d1} * N_{d2}$), which is a multiplication of the decimation rates ($N_{d1}$ and $N_d$), to support a plurality of RBWs for ADC output data.

According to another aspect of the present invention, there is provided a method of controlling a spectrum analyzer, the method including: (a) fixing a trace point (TP) determined in relation to a multiplication ($TP_1 * TP_2$) of primary and secondary digital frequency sweep counts ($P_1$ and $TP_2$) to a preset value when a span, which is a measurement target frequency bandwidth, a center frequency ($f_c$), a resolution bandwidth (RBW), and a video bandwidth (VBW) are set; (b) calculating a number ($N_{bwp}$) of bandwidth parts (BWP), which is a unit frequency bandwidth at every RF frequency sweep in an RF processing part, by $N_{BWP}$=ceil(span/40 MHz); (c) calculating $N_{d1}$ and $N_{d2}$, which are first and second decimation rates, for each of the BWPs, and configuring an RBW filter and a VBW filter; (d) capturing $N_S$ output samples of an ADC in a first input buffer at a synchronization time interval; (e) performing primary digital sweep on the samples stored in the first input buffer by an amount corresponding to a first frequency step, and decimating the samples through first CIC filtering using a first decimation rate ($N_{d1}$); (f) capturing the samples decimated through the first CIC filtering in a second input buffer, performing secondary digital sweep on the samples stored in the second input buffer by an amount corresponding to a second frequency step, and decimating the samples through second CIC filtering using a second decimation rate ($N_{d2}$); and (g) repeatedly performing the primary and secondary digital frequency sweeps and decimation processing until processing for all the BWPs is finished.

In the above configuration, $TP \leq TP_1 * TP_2$.

The first frequency step may be set to $bin * TP_2$, where $bin = span / TP$, and the second frequency step may be set to bin.

The capturing may be performed until a predetermined number ($N_s$) of samples are filled in the first input buffer, and when a time interval ends during the capturing, the capturing may be held and continuously performed at a next time interval.

For an output of the second CIC filtering, output samples of the second CIC filtering may be repeatedly processed by sequentially passing through the RBW filter, an envelope detector, a third CIC filter, the VBW filter, and a detector until processing for all $TP_2$ is finished.

In addition, h[n]', which is a coefficient of the RBW filter, may be determined by h[n]'=h[n]*w[n]', the RBW filter may be configured based on a window function of $$w[n] = a_0 - a_1 \cos\left(\frac{2\pi n}{N}\right) + a_2 \cos\left(\frac{4\pi n}{N}\right) - a_3 \cos\left(\frac{6\pi n}{N}\right),$$

where $a_0=0.3635819$, $a_1=0.4891775$, $a_2=0.1365995$, and $a_3=0.0106411$, a final window function may be determined by $w[n]' = w[n]^\alpha$ (where $\alpha$ is a constant for obtaining a bandwidth of the RBW filter), H[n], which is a frequency domain value of the RBW filter, and a length of the filter may be determined by a RBW sampling rate and the RBW, and h[n], which is a time domain value, may be obtained through inverse fast Fourier transform (IFFT).

According to the spectrum analyzer and the method of controlling the same of the present invention, advantages of an analog swept spectrum analyzer and a digital FFT spectrum analyzer are combined, so that the sweep time of the swept spectrum analyzer can be reduced by 4096 times or more such that performance of the swept spectrum analyzer can be comparable to performance of the FFT spectrum analyzer while using less resources than the FFT spectrum analyzer. Accordingly, a measurement result of a 5G new radio (NR) time division duplexing (TDD) signal in which the number of input samples is limited can be rapidly and easily obtained.

DETAILED DESCRIPTION OF THE INVENTION

Hereinafter, a spectrum analyzer and a method of controlling the same according to exemplary embodiments of the present invention will be described in detail with reference to the accompanying drawings.

Figure 1:
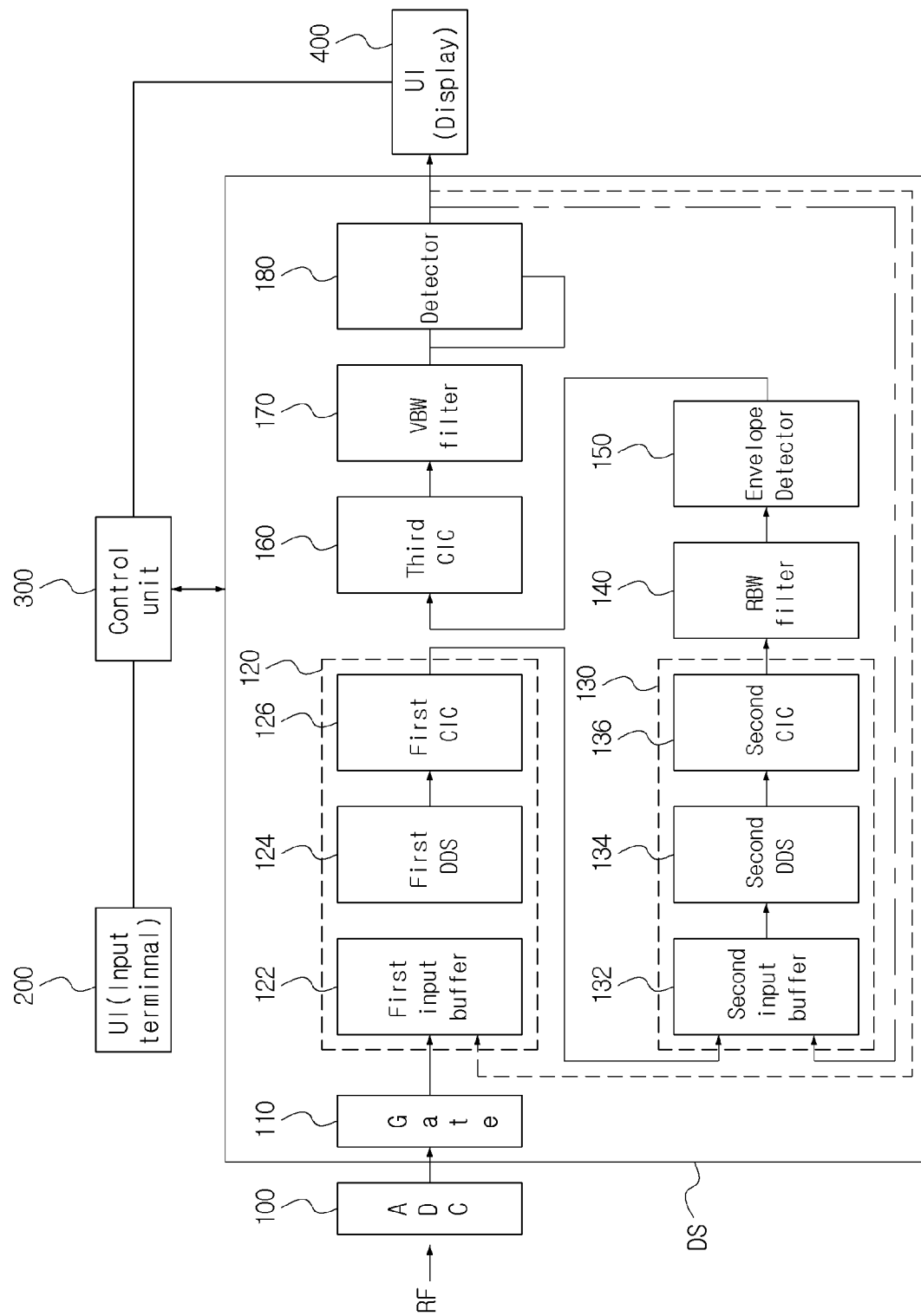
FIG. 1 is a block diagram showing a spectrum analyzer according to the present invention.

FIG. 1 is a block diagram showing a spectrum analyzer according to the present invention. As shown in FIG. 1, a spectrum analyzer according to the present invention may digitally operate based on a cascaded integrator comb (CIC) filter having a two-stage cascaded structure by taking only advantages of analog spectrum analysis and digital FFT spectrum analysis.

In detail, the spectrum analyzer according to the present invention may include: an input user interface (UI) 200 for receiving, from a user, a desired measurement item and various set values required for measuring the measurement item among items shown in Table 1, for example, a span, a resolution bandwidth (RBW), and a video bandwidth (VBW); an output UI 400 for displaying a measurement result to allow the user to recognize the measurement result; an RF processing part (not shown) for sweeping and outputting an input RF signal corresponding to at least one unit frequency band (bandwidth part; hereinafter abbreviated as "BWP"), for example, 40 MHz according to the span set by the user; an analog-to-digital converter (ADC) 100 for converting each analog BWP signal, which is subject to RF sweep and output through the RF processing part, into a digital data sample at a predetermined sample rate, for example, a rate of 122.88 Msps; a digital sweep part DS for sweeping the data sample passed through the ADC 100 while digitally decimating the data sample through a decimation processing block having a two-stage cascaded structure, and processing the swept data sample to increase a frequency sweep speed; and a control unit 300 for controlling the RF processing part and the digital sweep part DS according to various items input, set, and selected by the user through the input UI 200 to perform spectrum analysis and display (output) a result of the spectrum analysis through the output UI 400.

In the above configuration, the RF processing part, the ADC 100, the control unit 300, and the digital sweep part DS may be configured together in the same main body, and the input UI 200 and the output UI 400 may be implemented as a terminal having a touch screen display panel, for example, a mobile terminal such as a smartphone, a notebook PC, or a tablet PC, which is separate from the main body of the spectrum analyzer, to transmit and receive UI data to and from the main body of the analyzer through short-range wireless communication such as Wi-Fi.

The digital sweep part DS may be implemented as a field programmable gate array (FPGA). In this case, the control unit 300 may be attached to the FPGA, or may be implemented as a CPU separate from the FPGA. A control method (algorithm) shown in FIG. 2 may be mounted in the control unit 300 in the form of firmware.

In detail, the digital sweep part DS may include: a gate unit 110 which functions to analyze a spectrum in synchronization with a desired signal section, for example, a down-link (DL) section or an up-link (UL) section of a 5G time division duplexing (TDD) signal; first and second decimation processing blocks 120 and 130 respectively including first and second input buffers 122 and 132 connected in the two-stage cascaded structure to store data used while sweeping frequencies, first and second direct digital synthesizers (DDS) 124 and 134 configured by a numerically-controlled oscillator (NCO) to function as a local oscillator (U)) for generating a conversion frequency which is required for frequency sweep, and first and second CIC filters 126 and 136 for reducing an amount of processing target data by performing decimation required for efficient data processing which is suitable for the RBW set by the user; an RBW filter 140 and a VBW filter 170 for performing RBW filtering and VBW filtering functions set by the user, respectively; an envelope detector 150 for extracting a waveform of an output signal by squaring a complex In-phase/Quadrature-phase (IQ value, which is an output of the RBW filter 140, and obtaining a square root of the squared I/Q value; a third CIC filter 160 for performing decimation or interpolation suitable for an RBW-to-VBW ratio (RBW/VBW) set by the user; and a detector 180 for extracting four VBW output values of a maximum value (max), a minimum value (min), a sum, and a sample for an output of the VBW filter 170.

Meanwhile, signal synchronization at the gate unit 110 may be performed by using various signals such as an internal frame synchronization signal, a GPS signal, 1-pulse-per-second (1PPS) signal, or a 5G new radio (NR) sync signal block (SSB) signal.

A decimation rate ($N_{d1}$) of the first CIC filter and a decimation rate ($N_{d2}$) of the second CIC filter may be multiplied to obtain a total decimation rate ($N_d = N_{d1}*N_{d2}$).

| RBW | Target Fr (RBW × 8) | CIC $N_d$ (= $N_{d1}*N_{d2}$) | CIC#1 ($N_{d1}$) | CIC#1 Fr | CIC#2 ($N_{d2}$) | CIC#2 Fr | 1/RBW | Note |
|---|---|---|---|---|---|---|---|---|
| 10M | 80M | $2^0$ | $2^0$ | 122.88M | $2^0$ | 122.88M | 12.288 | 2 × I/Q cal. considered |
| 3M | 24M | $2^2$ | $2^2$ | 30.72M | $2^0$ | 30.72M | 10.24 | |
| 1M | 8M | $2^4$ | $2^4$ | 7.68M | $2^0$ | 7.68M | 7.68 | |
| 300k | 2.4M | $2^5$ | $2^5$ | 3.84M | $2^0$ | 3.84M | 12.8 | |

-continued

| RBW | Target Fr (RBW × 8) | CIC $N_d$ (= $N_{d1}*N_{d2}$) | CIC#1 ($N_{d1}$) | CIC#1 Fr | CIC#2 ($N_{d2}$) | CIC#2 Fr | 1/RBW | Note |
|---|---|---|---|---|---|---|---|---|
| 100k | 800k | 2^7 | 2^5 | 3.84M | 2^2 | 960k | 9.6 | CIC# 2 activated |
| 30k | 240k | 2^9 | 2^5 | 3.84M | 2^4 | 240k | 8 | |
| 10k | 80k | 2^10 | 2^5 | 3.84M | 2^5 | 120k | 12 | |
| 3k | 24k | 2^12 | 2^6 | 1.92M | 2^6 | 30k | 10 | |
| 1k | 8k | 2^14 | 2^7 | 960k | 2^7 | 7.5k | 7.5 | |
| 300 | 2.4k | 2^15 | 2^8 | 480k | 2^7 | 3.7k | 12.3333 | SPAN limited |
| 100 | 800 | 2^17 | 2^9 | 240k | 2^8 | 937.5 | 9.375 | |
| 30 | 240 | 2^19 | 2^10 | 120k | 2^9 | 234.375 | 7.8125 | |
| 10 | 80 | 2^20 | 2^10 | 120k | 2^10 | 117.1875 | 11.7188 | |
| 3 | 24 | 2^22 | 2^11 | 60k | 2^11 | 29.2969 | 9.7656 | |
| 1 | 8 | 2^24 | 2^12 | 30k | 2^12 | 7.3242 | 7.3242 | |

The first input buffer 122 and the second input buffer 132 may be implemented as DDR memories. The data stored in the first and second input buffers 122 and 132 may be reused without receiving additional data during the digital frequency sweep, so that a frequency sweep time may be reduced by the decimation rate of the first CIC filter 126 ($1/N_{11}$). The maximum number of stored samples in the first input buffer 122 may correspond to, for example, the number of output samples of the ADC 100 for 2 seconds (122.88 Ms*2), and the maximum number of stored samples in the second input buffer 132 may correspond to, for example, the number of output samples of the first CIC filter for 2 seconds (3.84 Ms*2).

Meanwhile, the decimation rates ($N_{d1}$ and $N_{d2}$) of the first and second CIC filters 126 and 136 and the total decimation rate ($N_d=N_{d1}*N_{d2}$), which is the multiplication of the decimation rates ($N_{d1}$ and $N_{d2}$), to support various RBWs for ADC output data having a sample rate of $F_s$=122.88 MHz may be determined as shown in Table 3 below.

[Table 3]

The results of Table 3 may be determined such that the total number of calculations for one frequency sweep is minimized as shown in Mathematical formula 2 below.

[Mathematical formula 2]

$$C_1 = N_S * TP = k * N_{d1} * N_{d2} * TP$$

$$C_2 = k*(N_{d1} + N_{d2}*TP_2)*TP_1 = k*(N_{d1}/TP_2 + N_{d2})*TP$$

$$TP = TP_1 * TP_2, \quad N_S = k*N_{d1}*N_{d2}$$

In Mathematical formula 2, $C_1$ denotes a calculation amount when a decimation processing block having a single-stage structure is provided, and $C_2$ denotes a calculation amount when a decimation processing block having a two-stage cascaded structure is provided as shown in FIG. 1. In addition, $TP_x$ (trace point), that is, $TP_1$ and $TP_2$ ($TP \leq TP_1*TP_2$) denote frequency sweep counts of the first and second decimation processing blocks 120 and 130, respectively, and $N_S$ denotes the number of processing samples.

Therefore, calculation efficiency of the spectrum analyzer according to the present invention may be determined as shown in Mathematical formula 3 below, so that a time required for the frequency sweep can be significantly reduced.

$$C_1/C_2 \sim N_{d1} \quad \text{[Mathematical formula 3]}$$

In more detail, due to characteristics of the swept spectrum analyzer, input data is required for each sweep point, and an identical calculation process has to be repeatedly performed at all sweep points until all input data is processed. However, in the present invention, the input buffer is used to reuse the sample stored in the second decimation processing block 130 at all sweep points, so that no input/output time of the first decimation processing block 120 is required to obtain a new sample. As a result, the frequency sweep time can be reduced by the decimation rate ($N_{d1}$) of the first decimation processing block 120. For example, since RBW/VBW=1 Hz in the case of the lower item in Table 2, a frequency sweep time through a conventional analog swept spectrum analyzer is 4000 [sec], whereas a frequency sweep time according to the present invention can be reduced by 4000 [sec]/4096, that is, reduced to within 1 [sec].

Meanwhile, since DL and UL signal frequencies of a frequency division duplexing (FDD) communication signal are separated from each other, and the frequencies are constant, a starting point of a signal is meaningless to the swept spectrum analyzer. However, in order to support analysis of a TDD communication signal such as a 5G signal, as described above, a gated spectrum analysis scheme in which a signal spectrum is calculated only in a predetermined time interval such as the DL or the UL has to be applied.

In addition, in order to support a wider span than an instantaneous frequency supported by the ADC 100, the RF sweep is required in the RF processing part. As described above, after one RF sweep frequency bandwidth, which is the BWP, is defined, a span bandwidth has to be divided into BWPs, and the BWPs has to be repeatedly processed. ADC samples for one BWP may be digitally batch-processed in the digital sweep part DS which is implemented as the FPGA.

Figure 2:
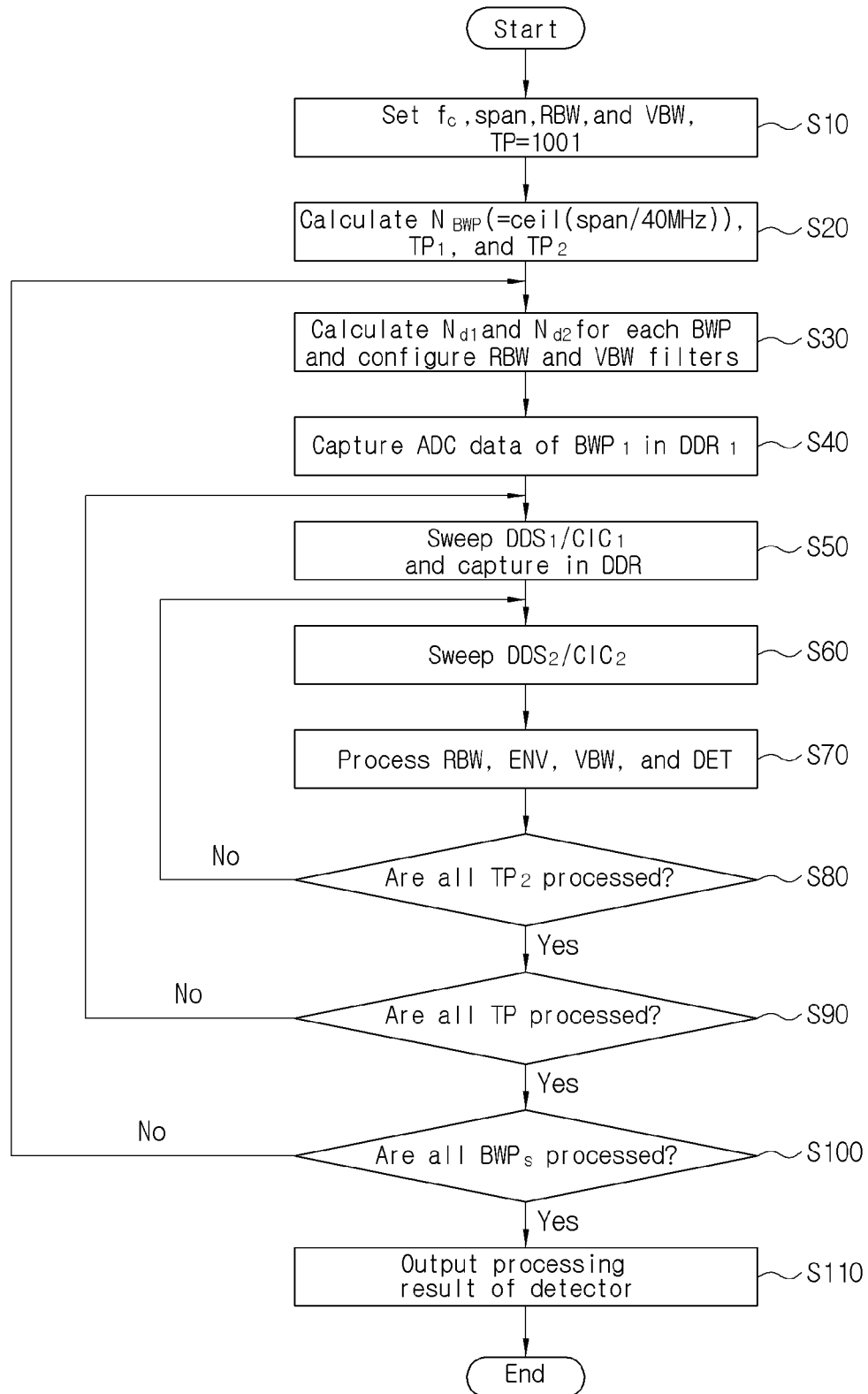
FIG. 2 is a flowchart for describing a method of controlling a spectrum analyzer according the present invention.

FIG. 2 is a flowchart for describing a method of controlling a spectrum analyzer according the present invention. The method may be performed by the control unit 300.

First, in step S10, a TP determined in relation to a multiplication of frequency sweep counts of the first and second decimation processing blocks 120 and 130 may be fixed to a preset value, for example, 1001. The TP may be determined in relation to a horizontal resolution of a display screen. In this case, the TP may be greater than or equal to $TP_1*TP_2$, and when the TP is equal to $TP_1*TP_2$, $TP_1$ and $TP_2$ are both divisors of TP.

Next, in step S20, by using the set value in step S10, the number ($N_{bwp}$) of BWPs, which has a unit frequency bandwidth, for example, a bandwidth of 40 MHz at every RF frequency sweep in the RF processing part, may be calculated by Mathematical formula 4 below.

$$N_{BWP} = \text{ceil(span/40 MHz)} \qquad \text{[Mathematical formula 4]}$$

Then, in step S30, $N_{d1}$ and $N_{d2}$, which are the decimation rates of the first and second decimation processing blocks 120 and 130, may be calculated for each of the BWPs, and the RBW filter 140 and the VBW filter 170 may be configured, in which $N_{d1}$ and $N_{d2}$ may be calculated by Table 3 above. In this case, individual BWPs may have mutually different RBWs and VBWs, and $N_{d1}$ and $N_{d2}$ are determined accordingly.

When initialization is completed through the above steps, the control unit 300 may activate the FPGA constituting the digital sweep part DS over a data stabilization time according to the RF frequency sweep.

In detail, the control unit 300 may capture $N_S$ output samples of the ADC 100, which operates at a predetermined sampling rate, for example, 122.88 Msps, in the first input buffer 122, which is implemented as, for example, a DDR memory, at a time interval in which synchronization is set by the gate unit 110 (step S40). When a time interval ends during the capturing, the capturing may be held and continuously performed at a next time interval. In this way, the capturing may be completed when a predetermined number (N) of samples are filled in the first input buffer 122, in which the maximum number of stored samples in the first input buffer 122 may correspond to, for example, the number of samples for 2 seconds (122.88 Ms*2).

Next, a frequency step may be set to a predetermined unit, for example, bin*$TP_2$, where bin=span/TP, and the first DDS 124 may sweep the samples stored in the first input buffer 122 by an amount corresponding to each frequency step and output the swept samples to the first CIC filter 126. Thereafter, the first CIC filter 126 may decimate input samples by using a first decimation rate ($N_{d1}$) calculated in step S30, so that the number of output samples of the first CIC filter 126 can be reduced to $N_S/N_{d1}$.

Then, the samples output from the first CIC filter 126 may be captured in the second input buffer 132 of the second decimation processing block 130 (step S50), so that a required storage space of the second input buffer 132 can be reduced to $N_S/N_{d1}$. The maximum number of stored samples in the second input buffer 132 may correspond to, for example, the number of output samples of the first CIC filter 126 for 2 seconds (3.84 Ms*2).

Next, the frequency step may be set to a predetermined unit, for example, bin, the second DDS 134 may sweep the samples stored in the second input buffer 132 by an amount corresponding to each frequency step and output the swept samples to the second CIC filter 136, and the second CIC filter 136 may decimate input samples by using a second decimation rate ($N_{d2}$) calculated in step S30 (step S60). Accordingly, the number of output samples of the second CIC filter 136 can be reduced to $N_S/(N_{d1}*N_{d2})$.

Then, in step S70, for an output of the second CIC filter 136, output samples of the second CIC filter 136 may be processed by sequentially passing through the RBW filter 140, the envelope detector 150, the third CIC filter 160, the VBW filter 170, and the detector 180. Subsequently, in step S80, it is determined whether processing for all $TP_2$ is finished.

As a result of the determination in step S80, step S60 and subsequent steps thereof may be repeatedly performed when the processing for all $TP_2$ is not finished, whereas the process may proceed to step S90 to determine whether processing for all TP is finished when the processing for all $TP_2$ is finished.

As a result of the determination in step S90, step S50 and subsequent steps thereof may be repeatedly performed when the processing for all TP is not finished, whereas the process may proceed to step S100 to determine whether processing for all the BWPs is finished when the processing for all TP is finished.

As a result of the determination in step S100, step S30 and subsequent steps thereof may be repeatedly performed when the processing for all the BWPs is not finished, whereas the process may proceed to step S110 to finally output a processing result of the detector 180 and terminate a program when the processing for all the BWPs is finished.

Meanwhile, in step S70, the RBW filter 140 has to be able to process exactly by an amount corresponding to the RBW for an arbitrary sampling rate. Accordingly, the RBW filter 140 may be configured based on a Blackman-Harris window function as shown in Mathematical formula 5 below.

$$w[n] = a_0 - a_1 \cos\left(\frac{2\pi n}{N}\right) + a_2 \cos\left(\frac{4\pi n}{N}\right) - a_3 \cos\left(\frac{6\pi n}{N}\right), \qquad \text{[Mathematical formula 5]}$$

where $a_0$=0.3635819, $a_1$=0.4891775, $a_2$=0.1365995, and $a_3$=0.0106411

A final window function may be determined by Mathematical formula 6 below.

$$w[n]' = w[n]^\alpha \qquad \text{[Mathematical formula 6]}$$

In Mathematical formula 6, a denotes a constant for obtaining a bandwidth of the RBW filter, and an optimal value has to be found through Mathematical formula 6. Thereafter, H[n], which is a frequency domain value of the RBW filter, and a length of the filter may be determined by a RBW sampling rate and the RBW, and h[n], which is a time domain value, may be obtained through inverse fast Fourier transform (IFFT). In addition, h[n]', which is a final coefficient of the RBW filter, may be obtained by Mathematical formula 7 below.

$$h[n]' = h[n] * w[n]' \qquad \text{[Mathematical formula 7]}$$

Finally, the configuration of the RBW filter is completed by appropriately determining a such that a final bandwidth of the RBW filter satisfies a standard of −3 dBc.

Although the spectrum analyzer and the method of controlling the same according to the exemplary embodiments of the present invention have been described in detail with reference to the accompanying drawings, the description is provided for illustrative purposes only, and various changes or modifications can be made without departing from the scope of the technical idea of the present invention. Therefore, it is to be understood that the scope of the present invention is defined by the appended claims. For example, although the decimation block has been described as having the two-stage cascaded structure in the above embodiments, the decimation block may have a cascaded structure with three or more stages.

In addition, since terms such as 'part' and 'block' are arbitrarily selected for convenience of logical or functional explanation, the terms should not be construed as limiting the scope of the present invention, and each functional configuration may be described as being integrated into larger units or divided into smaller units.

What is claimed is:

1. A method of controlling a spectrum analyzer, the method comprising:
   (a) fixing a trace point (TP) determined in relation to a multiplication ($TP_1*TP_2$) of primary and secondary digital frequency sweep counts ($TP_1$ and $TP_2$) to a preset value when a user selected span, which is a measurement target frequency bandwidth, a center frequency ($f_c$), a resolution bandwidth (RBW), and a video bandwidth (VBW) are set;
   (b) calculating a number ($N_{bwp}$) of bandwidth parts (BWP), which is a unit frequency bandwidth at every RF frequency sweep in an RF processing part, by $N_{BWP}$=ceil(span/40 MHz);
   (c) calculating $N_{d1}$ and $N_{d2}$, which are first and second decimation rates, for each of the BWPs, and configuring an RBW filter and a VBW filter;
   (d) capturing output samples, $N_S$, of an ADC in a first input buffer at a synchronization time interval;
   (e) performing primary digital sweep on the samples stored in the first input buffer by an amount corresponding to a first frequency step, and decimating the samples through first cascaded integrator comb (CIC) filtering using the first decimation rate ($N_{d1}$);
   (f) capturing the samples decimated through the first CIC filtering in a second input buffer, performing secondary digital sweep on the samples stored in the second input buffer by an amount corresponding to a second frequency step, and decimating the samples through second CIC filtering using the second decimation rate ($N_{d2}$), sequentially passing the output samples of the second CIC filtering through the RBW filter, an envelope detector, a third CIC filter, the VBW filter, and extracting output values from the VBW filter, and repeating step (f) until processing for all $TP_2$ is finished; and
   (g) repeatedly performing the primary and secondary digital frequency sweeps and decimation processing until processing for all the BWPs is finished.

2. The method of claim 1, wherein $TP \leq TP_1*TP_2$.

3. The method of claim 2, wherein the first frequency step is set to bin*$TP_2$, where bin=span/TP, and
   the second frequency step is set to bin.

4. The method of claim 3, wherein the capturing is performed until a predetermined number ($N_s$) of samples are filled in the first input buffer, and
   when a time interval ends during the capturing, the capturing is held and continuously performed at a next time interval.

5. The method of claim 1, wherein h[n]', which is a coefficient of the RBW filter, is determined by h[n]'=h[n]*w[n]',
   the RBW filter is configured based on a window function of $$w[n] = a_0 - a_1 \cos\left(\frac{2\pi n}{N}\right) + a_2 \cos\left(\frac{4\pi n}{N}\right) - a_3 \cos\left(\frac{6\pi n}{N}\right),$$

where $a_0$=0.3635819, $a_1$=0.4891775, $a_2$=0.1365995, and $a_3$=0.0106411,
   a final window function is determined by w[n]'=w[n]$^\alpha$, where $\alpha$ is a constant for obtaining a bandwidth of the RBW filter,
   H[n], which is a frequency domain value of the RBW filter, and a length of the filter are determined by a RBW sampling rate and the RBW, and
   h[n], which is a time domain value, is obtained through inverse fast Fourier transform (IFFT).

* * * * *